US007838195B2

(12) United States Patent
Lang et al.

(10) Patent No.: US 7,838,195 B2
(45) Date of Patent: Nov. 23, 2010

(54) PLANAR TEST SUBSTRATE FOR NON-CONTACT PRINTING

(75) Inventors: Charles D. Lang, Goleta, CA (US); Nigel Morton Coe, Santa Barbara, CA (US); Stephen Sorich, Goleta, CA (US); Nageswara Rao Tadepalli, Goleta, CA (US)

(73) Assignee: E. I. du Pont de Nemours and Company, Wilimington, DE (US)

( * ) Notice: Subject to any disclaimer, the term of this patent is extended or adjusted under 35 U.S.C. 154(b) by 560 days.

(21) Appl. No.: 11/759,286

(22) Filed: Jun. 7, 2007

(65) Prior Publication Data

US 2008/0003523 A1 Jan. 3, 2008

Related U.S. Application Data

(60) Provisional application No. 60/811,988, filed on Jun. 8, 2006.

(51) Int. Cl.
*G03F 7/00* (2006.01)
*G03F 7/004* (2006.01)

(52) U.S. Cl. ........................ 430/270.1; 430/7; 430/311; 430/303; 428/690

(58) Field of Classification Search ..................... 430/7, 430/270.1, 311, 313, 303; 428/690
See application file for complete search history.

(56) References Cited

U.S. PATENT DOCUMENTS

| | | | | |
|---|---|---|---|---|
| 4,003,312 | A | 1/1977 | Gunther | |
| 4,430,403 | A * | 2/1984 | Westdale et al. | 430/49.1 |
| 6,228,559 | B1 | 5/2001 | Oda | |
| 6,231,988 | B1 | 5/2001 | Kato et al. | |
| 6,416,932 | B1 * | 7/2002 | Ray et al. | 430/303 |
| 7,190,113 | B2 * | 3/2007 | Aoki | 313/506 |
| 2004/0075384 | A1 * | 4/2004 | Aoki | 313/506 |
| 2004/0155578 | A1 * | 8/2004 | Ito et al. | 313/506 |

FOREIGN PATENT DOCUMENTS

| | | | |
|---|---|---|---|
| DE | 39 11 934 | A1 | 10/1990 |
| EP | 0 401 439 | A1 | 12/1990 |
| EP | 932081 | A1 * | 7/1999 |
| EP | 1246011 | A2 * | 10/2002 |
| JP | 62-271741 | | 11/1987 |
| WO | WO 97/07986 | | 3/1997 |
| WO | WO 99/50069 | | 10/1999 |

OTHER PUBLICATIONS

CRC Handbook of Chemistry and Physics, 81st Edition, 2000-2001 (Book Not Supplied).

PCT International Search Report and Written Opinion for International Application No. PCT/US2007/013583 dated Feb. 27, 2008.

* cited by examiner

*Primary Examiner*—Amanda C. Walke
(74) *Attorney, Agent, or Firm*—John H. Lamming

(57) ABSTRACT

There is provided an essentially planar test substrate for non-contact printing. The substrate has a first layer having a first surface energy and having a planar measurement portion. A liquid containment pattern is over at least the measurement portion of the first layer. The liquid containment pattern has a second surface energy that is different from the first surface energy. The measurement portion of the first layer and the liquid containment pattern together are substantially planar.

21 Claims, 1 Drawing Sheet

PLANAR TEST SUBSTRATE FOR NON-CONTACT PRINTING

BACKGROUND INFORMATION

1. Field of the Disclosure

This disclosure relates in general to a test substrate for non-contact printing. The substrate can be used to optimize process and formulation variables.

2. Description of the Related Art

Non-contact printing processes are being developed for patterning electronic, optical, and biomedical devices—organic light-emitting diode ("OLED") displays, circuitry, transistor arrays, radio frequency identification ("RFID") tags, sensors, color filters, drug delivery systems, etc. These typically require precise deposition of a patterned printed layer with a uniform dry thickness. An attractive means for defining the printed pattern uses a reactive surface-active material as this approach has very high resolution and can be applied over many surfaces.

The pattern tolerances, thickness, and uniformity of a printed material depend in a complex and coupled manner on process variables (e.g., print head speed, ink flow rate, temperature, nozzle design), the formulation of the liquid ink (e.g., concentrations of the solvents & solutes, viscosity, surface tension), substrate design (e.g., surface chemistry and roughness, patterns where wetting is desired vs. prohibited), and ink drying. An efficient means is needed for simultaneously optimizing these variables and thus printing quality.

SUMMARY

There is provided an essentially planar test substrate comprising:

a first layer having a first surface energy and having a planar measurement portion, a liquid containment pattern over at least the measurement portion of the first layer, said liquid containment pattern having a second surface energy, wherein the measurement portion of the first layer and the liquid containment pattern together are substantially planar, and the second surface energy is significantly different from the first surface energy.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying FIGURE to promote understanding of concepts as presented herein.

Figure 1:
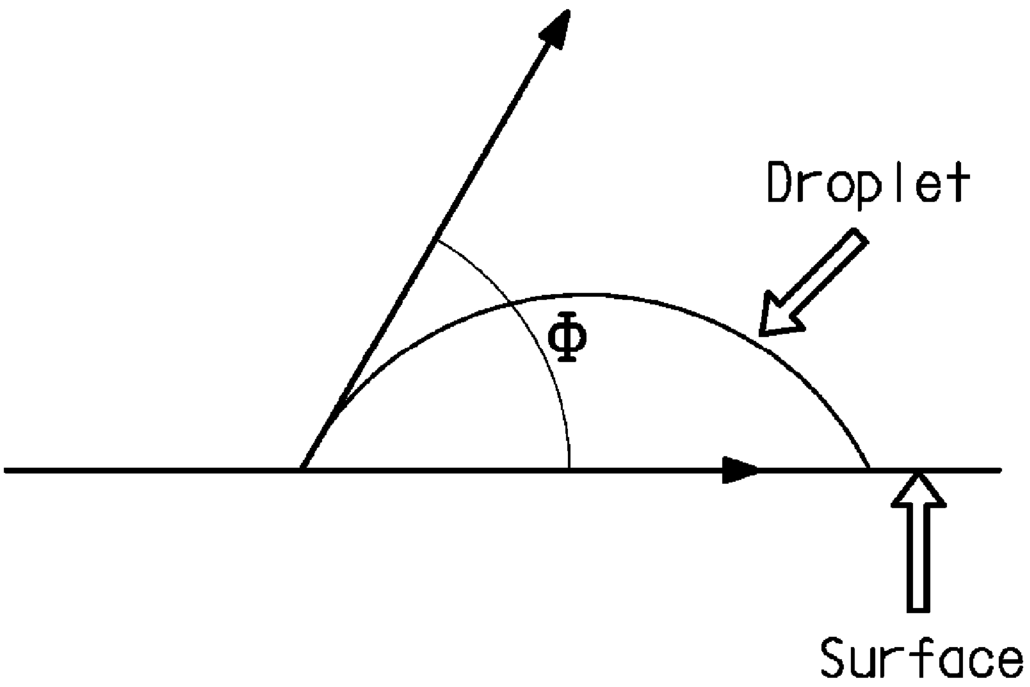
FIG. 1 includes an illustration of contact angle.

Skilled artisans appreciate that objects in the figures are illustrated for simplicity and clarity and have not necessarily been drawn to scale. For example, the dimensions of some of the objects in the figures may be exaggerated relative to other objects for visual clarity so as to help improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the First Layer, the Containment Pattern, Reference Marks, Printing, and finally Examples.

1. Definitions and Clarification of Terms

Before addressing details of embodiments described below, some terms are defined or clarified.

The term "fluorinated" when referring to an organic compound, is intended to mean that one or more of the hydrogen atoms in the compound have been replaced by fluorine. The term encompasses partially and fully fluorinated materials.

The term(s) "radiating/radiation" means adding energy in any form, including heat in any form, within the entire electromagnetic spectrum, including subatomic particles, regardless of whether such radiation is in the form of rays, waves, or particles.

The term "reactive surface-active composition" is intended to mean a composition that comprises at least one material which is radiation sensitive, and when the composition is applied to a layer, the surface energy of that layer is reduced. Exposure of the reactive surface-active composition to radiation results in the change of at least one physical property of the composition. The term is abbreviated "RSA", and refers to the composition both before and after exposure to radiation.

The term "radiation sensitive" when referring to a material, is intended to mean that exposure to radiation results in a change of at least one chemical, physical, or electrical property of the material.

The term "surface energy" is the energy required to create a unit area of a surface from a material. A characteristic of surface energy is that liquid materials with a given surface energy will not wet surfaces with a lower surface energy. The surface tension of a liquid is also referred to herein as surface energy.

The term "significantly different", when referring to surface energies, is intended to mean that the contact angle of phenylhexane on a first film having a first surface energy is at least 10° different from the contact angle of phenylhexane on a second film having a second surface energy.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "liquid composition" is intended to mean a liquid medium in which a material is dissolved to form a solution, a liquid medium in which a material is dispersed to form a dispersion, or a liquid medium in which a material is suspended to form a suspension or an emulsion. "Liquid medium" is intended to mean a material that is liquid without the addition of a solvent or carrier fluid, i.e., a material at a temperature above its solidification temperature.

The term "measurement portion" refers to that portion of the test substrate on which the printing test will be conducted. The measurement portion may represent a large part or small part of the total test substrate.

The term "liquid containment pattern" is intended to mean a pattern within or on a workpiece, wherein such one or more patterns, by themselves or collectively, serve a principal function of constraining or guiding a liquid within an area or region as it flows over the workpiece.

The term "substantially planar" as it refers to the first layer and containment pattern, is intended mean that the variation in height of the first layer and the containment pattern does not interfere with the measurement of critical dimensions of additional layers. In one embodiment, the substantially planar containment pattern has a thickness no greater than 100 Å. In one embodiment, the thickness is no greater than 10 Å.

The term "liquid medium" is intended to mean a liquid material, including a pure liquid, a combination of liquids, a solution, a dispersion, a suspension, and an emulsion. Liquid medium is used regardless whether one or more solvents are present.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC *Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. First Layer

The first layer in the test substrate is the layer on which the printed layer is to be deposited. The first layer is made of the same material or very similar material as in the actual device in which the printing will be used.

In some embodiments, the first layer comprises a support. The term "support" is intended to mean a base material that can be either rigid or flexible and may be include one or more layers of one or more materials, which can include, but are not limited to, glass, polymer, metal or ceramic materials or combinations thereof.

In some embodiments, the first layer comprises an organic layer on a support. The organic layer can be an active layer for a device. The term "active material" refers to a material which electronically facilitates the operation of the device. Examples of active materials include, but are not limited to, materials which conduct, inject, transport, or block a charge, where the charge can be either an electron or a hole; or materials which emit radiation or exhibit a change in concentration of electron-hole pairs when receiving radiation. The organic layer can be an inactive layer for a device. Examples of inactive materials include, but are not limited to, planarization materials, insulating materials, and environmental barrier materials.

In some embodiments, the first layer comprises an inorganic layer on a support. The inorganic layer can be an electrode for a device.

At least the measurement portion of the first layer is approximately flat and planar. This is the area on which the containment pattern will be applied and the printing tested. Areas outside the planar portion may have other structures, as desired.

The first layer can be formed by any deposition technique, including vapor deposition techniques, liquid deposition techniques, and thermal transfer techniques. In one embodiment, the first layer is deposited by a liquid deposition technique, followed by drying. In this case, a first material is dissolved or dispersed in a liquid medium. The liquid deposition method may be continuous or discontinuous. Continuous liquid deposition techniques, include but are not limited to, spin coating, roll coating, curtain coating, dip coating, slot-die coating, spray coating, and continuous nozzle coating. Discontinuous liquid deposition techniques include, but are not limited to, ink jet printing, gravure printing, flexographic printing and screen printing. In one embodiment, the first layer is deposited by a continuous liquid deposition technique.

3. Containment Pattern

The containment pattern is applied to the measurement portion of the first layer. The containment pattern has a surface energy that is substantially different from the surface energy of the first layer. The surface energy of the containment pattern may be higher or lower than that of the first layer. In some embodiments, the surface energy of the containment pattern is lower than that of the first layer.

The difference in surface energies between the first layer and the containment pattern are used to define the areas to be printed. In some embodiments, the liquid printing composition has a surface energy that is less than the surface energy of the first layer, but approximately the same as or greater than the surface energy of the containment pattern. Thus, the liquid composition will wet the first layer, but will be repelled from the containment pattern areas. The liquid may be forced onto the containment pattern during printing, but it will de-wet.

In one embodiment, the containment pattern is formed by applying a low-surface-energy material ("LSE") over the first layer in a pattern. The term "low-surface-energy material" is intended to mean a material which forms a layer with a low surface energy. The LSE forms a containment pattern having a surface energy lower than that of the first layer. In one embodiment, the LSE is a fluorinated material. The LSE can be applied by vapor deposition or thermal transfer. The LSE can be applied by a discontinuous liquid deposition technique from a liquid composition.

In one embodiment, the containment pattern is formed by depositing a blanket layer of an LSE. The LSE is then removed in a pattern. This can be accomplished, for example, using photoresist techniques or by laser ablation. In one embodiment, the LSE is thermally fugitive and is removed by treatment with an IR laser.

In one embodiment, the containment pattern is formed by applying a reactive surface-active composition ("RSA") to the first layer. The RSA is a radiation-sensitive composition having a low surface energy. In one embodiment, the RSA is a fluorinated material. When exposed to radiation, at least one physical property and/or chemical property of the RSA is changed such that the exposed and unexposed areas can be physically differentiated. Treatment with the RSA lowers the surface energy of the material being treated. After the RSA is applied to the primer layer, it is exposed to radiation in a pattern, and developed to remove either the exposed or unexposed areas. Examples of development techniques include, but are not limited to, heating, treatment with a liquid composition, treatment with an absorbant material, treatment with a tacky material, and the like.

In one embodiment, the RSA reacts with the underlying first layer when exposed to radiation. The exact mechanism of this reaction will depend on the materials used. After exposure to radiation, the RSA is removed in the unexposed areas by a suitable development treatment, as discussed above. In some embodiments, the RSA is removed only in the unexposed areas. In some embodiments, the RSA is partially removed in the exposed areas as well, leaving a thinner layer in those areas. In some embodiments, the RSA that remains in the exposed areas is less than 50 Å in thickness. In some embodiments, the RSA that remains in the exposed areas is essentially a monolayer in thickness.

4. Reference Marks

A containment pattern that does not interfere with measurement of critical dimensions is often difficult to locate when aligning precision printing and measurement equipment. In some embodiments, therefore, the test substrate includes visible reference marks to allow alignment of a printer, an automated measurement system, etc. These marks may be printed, etched, engraved, or otherwise applied in a manner so they are reliable and are not degraded by subsequent processing of the test substrate. In one embodiment, the alignment marks are etched using a photolithographic process. When an RSA is used to form the containment pattern, the resolution and precision of that pattern and the reference marks will be similar.

5. Printing

Types of non-contact printing include ink jet printing, continuous nozzle printing, and their variants Often printing must be performed on substrates that are not planar, i.e., they possess structure at heights differing from the nominal plane to be printed. Structure may be due to circuitry, or may be required to contain an ink to a specific region, and other factors. It is often difficult to measure critical dimensions of printed materials when structure is present. Critical dimensions may include dry layer thickness, line width, line position vs. the desired position, by way of example. Difficulties arise, as the dimensions of the dried printed layer may only be small fractions of the dimensions of the structure; this is especially true when measuring the thickness (and especially uniformity of thickness) of a printed material. Hence variations in the structure may induce variations in the printed layer and make such variations difficult to measure or quantify.

The new planar test substrate described herein allows unambiguous measurement of film thickness and uniformity. The containment pattern and first layer in the measurement region are substantially planar. Other variations in height, such as alignment marks, are placed outside the measurement region.

One metric characterizing process capability is to determine the smallest feature that can be printed reliably. The containment pattern to make this determination has features of varying sizes, and with various distances between the features. Taken together, feature size and spacing characterize the resolution that can be printed.

Another metric is the ratio of space available for printing features (display pixels, circuitry, medicinal patches, etc.) vs. the margin required between printed features to prevent undesirable over-printing (color mixing, short circuits, chemical contamination, crosstalk, etc.). This is sometimes referred to as fill factor, or aperture ratio. On the test substrate, the space available for printing corresponds to the region where the ink wets, and the margin corresponds to the region where ink is repelled. The containment pattern includes patterns with various fill factors.

Other metrics can be imagined based on the geometry to be printed, e.g., the ability of an ink to spread and fill various geometric patterns other than simple straight lines: ovals, rectangles, constrictions, diverging lines and curves, and the like. An example is testing the ability for ink to flow around a right-angle bend in a circuit line defined by the containment pattern.

All these test patterns are separated by a sufficient distance to allow reliable measurement of the smallest dimensions of interest; typically these dimensions are on the order of microns or millimeters. To reduce cost and the time required for printing a statistically significant number of samples our invention includes many repeated patterns, allowing replicated measurements, and a way to assess uniformity across a relatively large area. The definition of "large area" depends on the device being printed, but is typically on the order of millimeters, centimeters, or meters.

EXAMPLES

The concepts described herein will be further illustrated in the following example, which does not limit the scope of the invention described in the claims.

Example

This example describes preparing test substrates and using them to select an appropriate process tool.

Two 15 cm square sheets of 0.7 mm thick glass were sputter coated with ca. 130 nm of ITO on one side. The ITO was patterned via photolithography to create alignment targets for printing and thickness measurement. The ITO was not patterned in measurement portions, where printing and thickness measurements would be performed. A coating of HT12 from Sumitomo Chemical Co. (Tokyo, Japan) was applied by spin coating from ca. 0.4% w/v in toluene to obtain a dry thickness of ca. 20 nm. The coatings were cured in a nitrogen-purged convection oven at 200 C. A solution of ca. 3% w/v of heneicosafluorododecyl acrylate (HFDA) in perfluorooctane was spin coated over the cured primer coatings by applying 5 ml of solution and spinning at 600 rpm for 60 seconds. Two different spin coaters were used to apply the HFDA, Coater H and Coater C. (The goal of the test was to compare the performance of these coaters by measuring the uniformity of printed line widths over the area of the test substrate.) The substrate was exposed to 10 $J/cm^2$ of collimated ultraviolet radiation at a nominal wavelength of 360 nm through a photomask to create a pattern of parallel lines separated by 0.106 mm, in registration with the alignment locations in the ITO layer. In regions where the HFDA received radiation through the photomask it grafted to the surface of the primer coating. HFDA that was not grafted to the primer coating was removed by evaporation at 130 C for 30 minutes in a nitrogen-purged convection oven. This created planar test substrates with six printing patterns having the feature sizes (printing lanes) shown below. The ink wets the surface within the printing lanes, and dewets outside the printing lanes. The uniformity of the non-wetting surface determines the uniformity of the printed line width.

An emissive ink containing BH215 & BD119 from Idemitsu Kosan Ltd. (Chiba, Japan) was printed from a mixture of 90% toluene and 10% 3,4-dimethyl anisole using a DNS nozzle printer at 43 microliters/minute from an 11 micron nozzle, at 3 m/s nozzle speed. The printed ink lines were dried at ambient temperature in air. A Veeco NT3300 optical profilometer was used to measure the width of the dried ink lines; about 40 lines were sampled from each of the six printed patterns, at 7 locations across the width of the plate. The table below shows the results:

| Pattern | Printing lane, µm | Printed line std deviation, µm | |
|---|---|---|---|
| | | Coater H | Coater C |
| 1 | 74 | 0.7 | 0.6 |
| 2 | 64 | 2.0 | 0.5 |
| 3 | 53 | 1.4 | 0.8 |
| 4 | 42 | 1.6 | 1.5 |
| 5 | 32 | 1.8 | 1.2 |
| 6 | 21 | 2.3 | 1.3 |

In all cases the uniformity of the containment surface provided by Coater C gives printed lines with lower standard deviations. Coater C is preferred for applying the HFDA solution.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment or in other embodiments.

Conversely, various features that are, for brevity, described in the context of a single embodiment, may also be provided separately or in any subcombination.

What is claimed is:

1. An essentially planar test substrate comprising:

a first layer having a first surface energy and having a planar measurement portion, a liquid containment pattern having a thickness no greater than 100 Å over at least the measurement portion of the first layer, said liquid containment pattern having a second surface energy, wherein the measurement portion of the first layer and the liquid containment pattern together are substantially planar, and the second surface energy is significantly different from the first surface energy.

2. The test substrate of claim 1 wherein the first layer comprises a support.

3. The test substrate of claim 1 wherein the first layer comprises an organic layer on a support.

4. The test substrate of claim 3 wherein the organic layer comprises at least one active material.

5. The test substrate of claim 3 wherein the organic layer comprises at least one inactive material.

6. The test substrate of claim 1 wherein the first layer comprises an inorganic layer.

7. The test substrate of claim 1 wherein the first layer is formed by a technique selected from the group consisting of vapor deposition, liquid deposition, and thermal transfer.

8. The test substrate of claim 1 wherein the containment pattern has a surface energy higher than that of the first layer.

9. The test substrate of claim 1 wherein the containment pattern has a surface energy lower than that of the first layer.

10. The test substrate of claim 1 wherein the containment pattern comprises an LSE material.

11. The test substrate of claim 10 wherein the LSE material is fluorinated.

12. The test substrate of claim 1 further comprising a liquid printing composition.

13. The test substrate of claim 12 wherein the liquid printing composition has a surface energy that is less than the surface energy of the first layer, but approximately the same as or greater than the surface energy of the containment pattern.

14. The test substrate of claim 1 wherein the liquid containment pattern comprises an RSA composition.

15. The test substrate of claim 14 wherein the RSA composition is fluorinated.

16. A method of forming a containment pattern on an essentially planar test substrate including a first layer having a first surface energy and having a planar measurement portion, and a liquid containment pattern having a thickness no greater than 100 Å over at least the measurement portion of the first layer, said liquid containment pattern having a second surface energy, wherein the measurement portion of the first layer and the liquid containment pattern together are substantially planar, and the second surface energy is significantly different from the first surface energy, comprising:

applying an RSA composition to the first layer to form the containment pattern, and exposing the RSA composition to radiation in a pattern whereby some areas of the containment pattern are exposed and some areas are unexposed.

17. The method of claim 16 further comprising developing the RSA composition after exposure to radiation to remove either the exposed areas or the unexposed areas.

18. The method of claim 16 wherein the RSA composition is fluorinated.

19. The method of claim 16 wherein developing comprises techniques selected from the group consisting of heating, treatment with a liquid composition, treatment with an absorbent material, and treatment with a tacky material.

20. The method of claim 16 wherein the RSA composition reacts with the first layer when exposed to radiation, further comprising developing the RSA composition after exposure to remove the RSA composition in the unexposed areas.

21. The method of claim 20 further comprising developing the RSA composition after exposure to partially remove RSA composition in the exposed areas.

* * * * *